US008275342B2

(12) United States Patent
Ginsburg et al.

(10) Patent No.: US 8,275,342 B2
(45) Date of Patent: Sep. 25, 2012

(54) DOWNCONVERSION MIXER

(75) Inventors: Brian P. Ginsburg, Allen, TX (US);
Vijay B. Rentala, Plano, TX (US);
Srinath M. Ramaswamy, Murphy, TX (US); Baher S. Haroun, Allen, TX (US);
Eunyoung Seok, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 116 days.

(21) Appl. No.: 12/871,626

(22) Filed: Aug. 30, 2010

(65) Prior Publication Data

US 2012/0049972 A1    Mar. 1, 2012

(51) Int. Cl.
*H04B 1/26*    (2006.01)
*H04K 3/00*    (2006.01)

(52) U.S. Cl. .......................... 455/326; 327/113; 327/116

(58) Field of Classification Search .................. 455/323, 455/326; 327/113, 116
See application file for complete search history.

(56) References Cited

U.S. PATENT DOCUMENTS

| | | | | |
|---|---|---|---|---|
| 5,006,811 A | * | 4/1991 | Kruger | 329/354 |
| 5,410,743 A | * | 4/1995 | Seely et al. | 455/326 |
| 2007/0135074 A1 | | 6/2007 | Igarashi et al. | |
| 2010/0093293 A1 | * | 4/2010 | Grebennikov et al. | 455/150.1 |

FOREIGN PATENT DOCUMENTS

| | | |
|---|---|---|
| JP | 11017456 | 1/1999 |
| JP | 11191717 | 7/1999 |

OTHER PUBLICATIONS

"A Balanced Power Amplifier Utilizing the Reflected Input Power," 2009 IEEE International Symposium on Radio-Frequency Integration Technology, pp. 88-91 (Jongsik Lim, Chunseon Park, Jakyung Koo, Hyeonwon Cha, Yongchae Jeong, Sang-Min Han, and Dal Ahn. PCT Search Report mailed Sep. 29, 2011.

* cited by examiner

*Primary Examiner* — Lee Nguyen
(74) *Attorney, Agent, or Firm* — John J. Patti; Wade J. Brady, III; Frederick J. Telecky, Jr.

(57) ABSTRACT

At very high frequencies, generally above 100 GHz, the performance of traditional radio frequency (RF) circuitry begins to significantly limit performance. An example is the hybrid coupler, which can have a relatively narrow 90° bandwidth in these frequency ranges. Here, however, a branch-line hybrid coupler (which has been integrated into a quadrature downconversion mixer) has been modified. Namely, an adjustable impedance network has been coupled to isolation port (which has traditionally been terminated) to substantially increase the tuning range and expand the bandwidth of the quadrature mixer within these very high frequency ranges.

18 Claims, 5 Drawing Sheets

DOWNCONVERSION MIXER

TECHNICAL FIELD

The invention relates generally to a mixer and, more particularly, to a downconversion mixer that uses a branch-line hybrid coupler.

BACKGROUND

Turning to FIG. 1A of the drawings, a conventional branch-line hybrid coupler 100 can be seen. Typically, coupler 100 has four ports and four transmission lines 102-1 through 102-4. Each of these four transmission lines is a one-quarter wavelength transmission line (for a given target frequency). Port 1 is often referred to as an "input port," which receives an input signal, while port 2 and 3 are referred to as "output ports." Because the of geometry of coupler 100, the output signal at port 2 is 90° out-of-phase from the input signal, while the output signal at port 3 is 180° out-of-phase from the input signal. This arrangement also allows the power to be split evenly between ports 2 and 3. Port 4 is often referred to as an "isolation port" and is usually terminated with no theoretical loss; an example of such an arrangement can be seen in FIG. 2 of U.S. Pat. No. 5,410,734.

The coupler 100, however, is sensitive to line loss. As it can be observed in FIGS. 1B and 1C, the 90° bandwidth decreases as attenuation increases. In particular, in FIG. 1B, at about 160 GHz, the phase difference between ports 2 and 3 is about 90°, and in FIG. 1C the attenuation for ports 2 and 3 or power difference between ports 2 and 3, and port 1 at about 160 GHz is about −4 dB. Moreover, the gain matching is fine, with more loss. Therefore, there is a need for an improved mixer.

Another conventional circuit that uses hybrid couplers is Lim et al., "A Balanced Power Amplifier Utilizing the Reflected Input Power," 2009 *IEEE International Symposium on Radio-Frequency Integration Technology*, pgs. 88-91.

SUMMARY

A preferred embodiment of the present invention, accordingly, provides an apparatus. The apparatus comprises a quadrature mixer having a branch-line hybrid coupler with an isolation port, wherein the quadrature mixer receives an input signal and a local oscillator signal, and wherein the quadrature mixer outputs an in-phase signal and a quadrature signal; and an adjustable impedance network that is coupled to the isolation port, wherein the adjustable impedance network is controlled by a control signal.

In accordance with a preferred embodiment of the present invention, the adjustable impedance circuit further comprises: a capacitive network that is coupled to the isolation port and that receives the control signal; a resistive network that is coupled to the capacitive network; and a inductive network that is coupled to the resistive network.

In accordance with a preferred embodiment of the present invention, the capacitive network further comprises a switched capacitor array.

In accordance with a preferred embodiment of the present invention, the capacitive network further comprises a plurality of varactors coupled in series with one another, and wherein the control signal further comprises a control voltage that is received at a node between at least two of the varactors.

In accordance with a preferred embodiment of the present invention, the inductive network further comprises an inductor that is coupled in parallel to the capacitive network.

In accordance with a preferred embodiment of the present invention, the resistive network further comprises a resistor that is coupled in parallel to the capacitive network.

In accordance with a preferred embodiment of the present invention, the adjustable impedance network further comprises an adjustment circuit that is coupled in parallel to the capacitive network.

In accordance with a preferred embodiment of the present invention, the adjustment circuit further comprises a MOS transistor that receives an adjustment voltage at its gate.

In accordance with a preferred embodiment of the present invention, an apparatus is provided. The apparatus comprises a transconductance circuit that receives an input signal; a hybrid coupler having a first port, a second port, a third port, and a fourth port, wherein the first port is coupled to the transconductance circuit; a first switching circuit that is coupled to the second port; a second switching circuit that is coupled to the third port; an input circuit that is coupled to each of the first and second switching circuits, wherein the second input circuit receives a local oscillator signal; and an adjustable impedance network that is coupled to the fourth port, wherein the adjustable impedance network is controlled by a control signal.

In accordance with a preferred embodiment of the present invention, an apparatus is provided. The apparatus comprises a transconductance circuit having: a first differential pair of NMOS transistors, wherein each NMOS transistor from the first differential pair receive portion of a radio frequency (RF) input signal at its gate; and an inductor that is coupled between the drains of the NMOS transistors in the first differential pair; a pair of biasing transistor that are each coupled to the inductor; and a coupler that is coupled to each of the pair of biasing transistors; a hybrid coupler having a first port, a second port, a third port, and a fourth port, wherein the first port is coupled to the coupler; a first switching circuit having: a first transformer that is coupled to the second port; a third differential pair of NMOS transistor that are each coupled to the first transformer; and a fourth differential pair of NMOS transistors that are each coupled to the first transformer; a second switching circuit having: a second transformer that is coupled to the third port; a fifth differential pair of NMOS transistor that are each coupled to the second transformer; and a sixth differential pair of NMOS transistors that are each coupled to the second transformer; an input circuit having a third transformer that is coupled to each of the first and second switching circuits, wherein the third transformer receives a local oscillator signal; and an adjustable impedance network having: a capacitive network that is coupled to the fourth port and that receives a control signal; a resistive network that is coupled to the capacitive network; and a inductive network that is coupled to the resistive network.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1A:
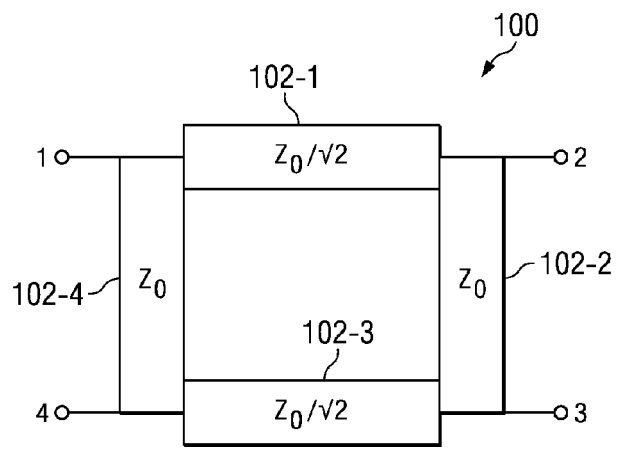
FIG. 1A is a block diagram of an example of a conventional branch-line hybrid coupler.
Figure 1B:
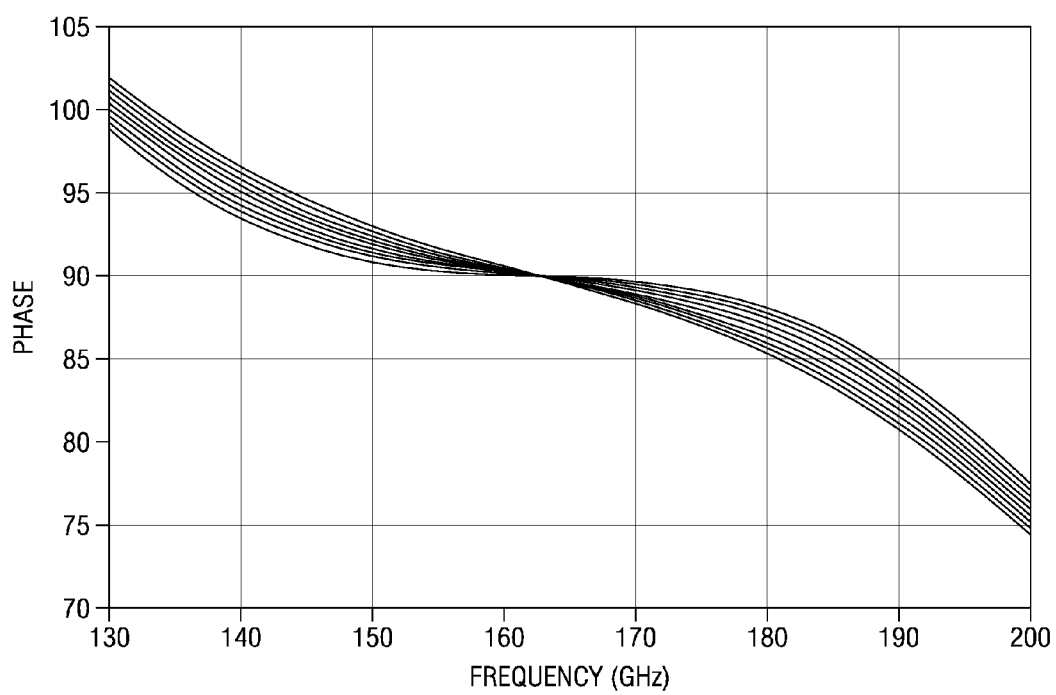
FIGS. 1B and 1C are graphs depicting the operation of the coupler of FIG. 1.
Figure 1C:
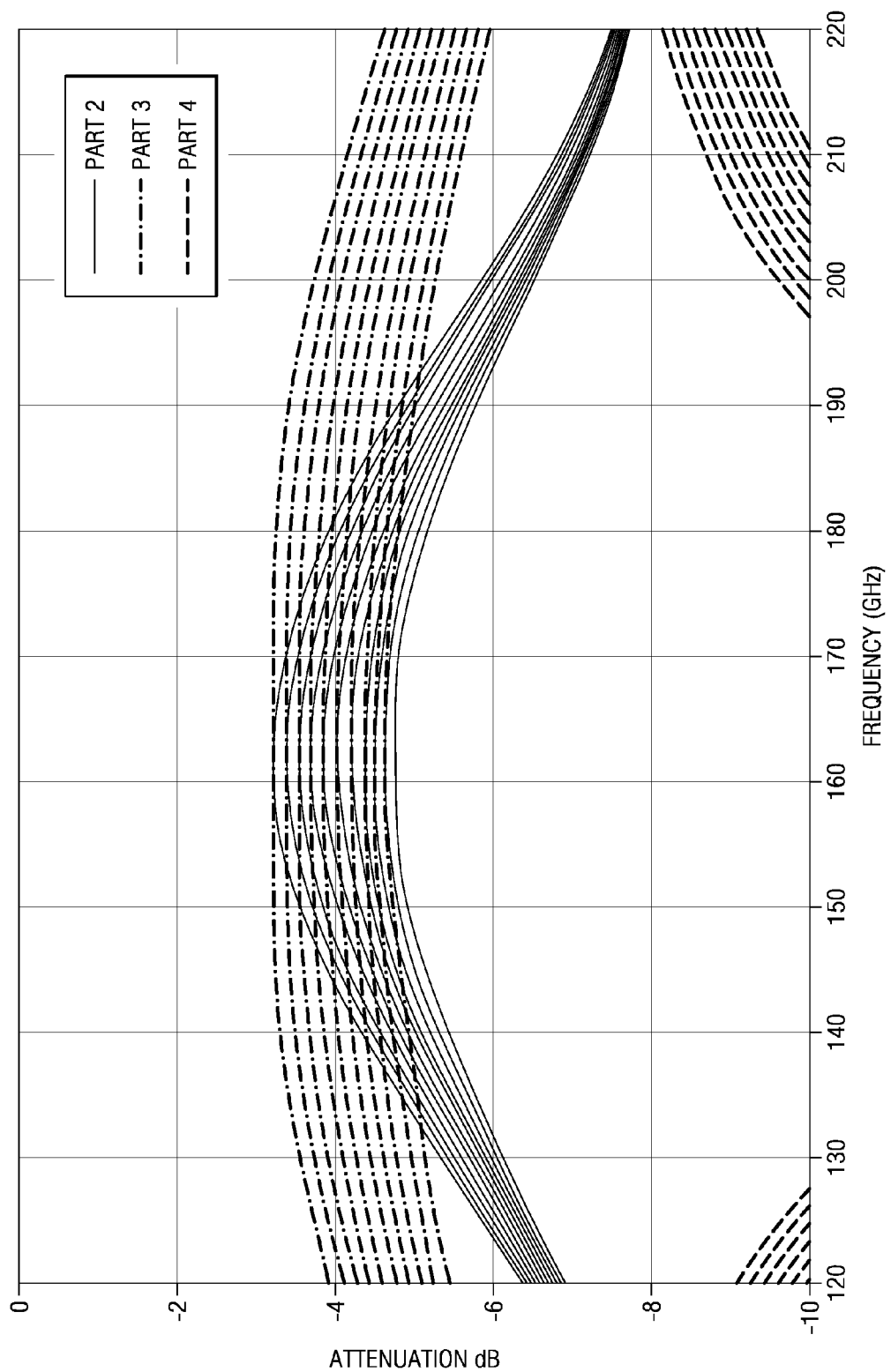

Refer now to the drawings wherein depicted elements are, for the sake of clarity, not necessarily shown to scale and wherein like or similar elements are designated by the same reference numeral through the several views.

Figure 2:
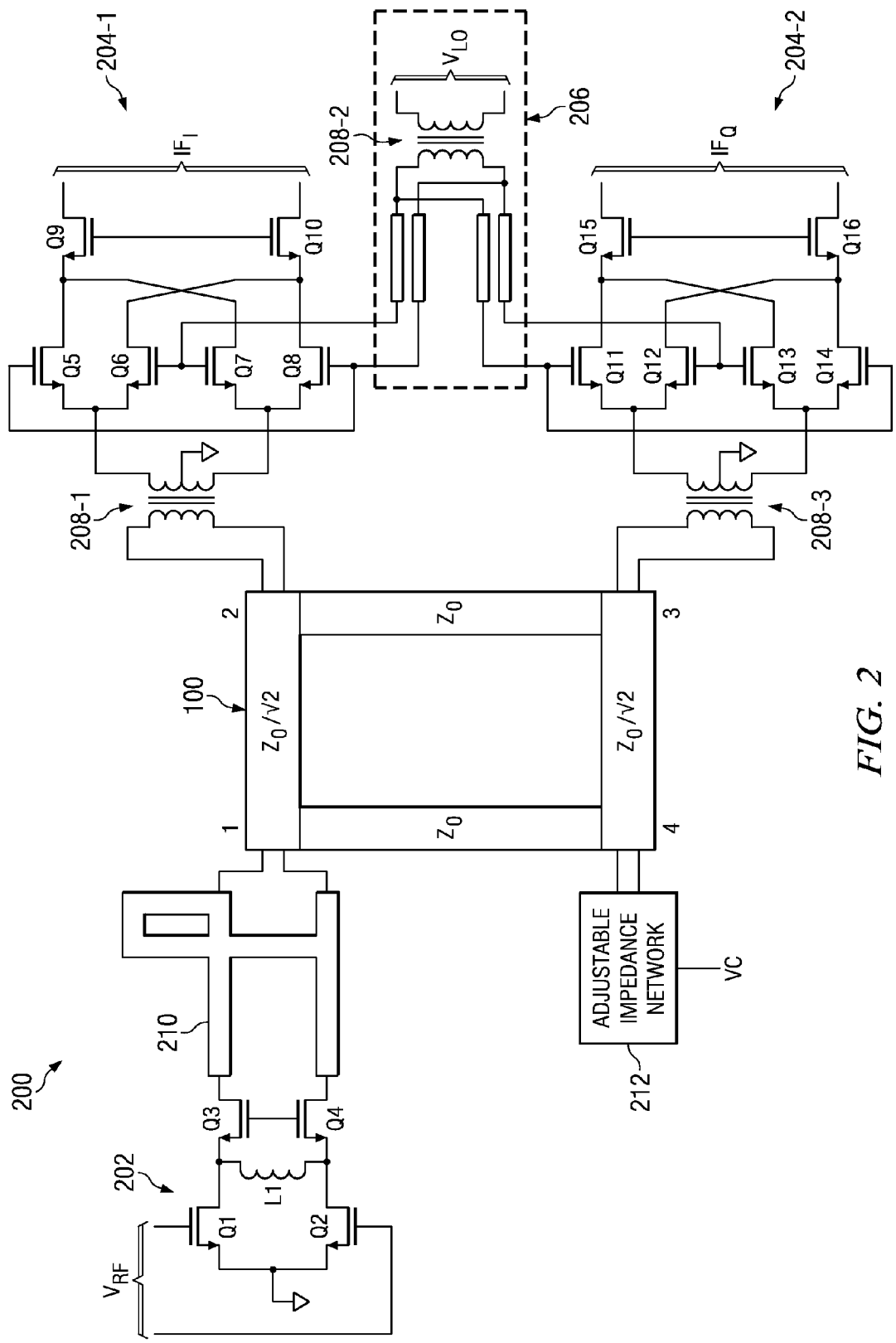
FIG. 2 is a block diagram of an example of a downconversion mixer in accordance with a preferred embodiment of the present invention.

Turning to FIG. 2, a downconverter mixer 200 in accordance with a preferred embodiment of the present invention can be seen. Mixer 200 generally comprises a transconductance circuit 202, a hybrid coupler 100, switching circuits 204-1 and 204-2, an adjustable impedance network 212, and a local oscillator input circuit 206. The transconductance circuit 202 generally comprises a differential pair of NMOS transistors Q1 and Q2 that receive a radio frequency (RF) signal $V_{RF}$ at their gates, an inductor L1, and cascode transistors Q3 and Q4, and coupler 210. Each of these switching circuits 204-1 and 204-2 respectively includes a transformer 208-1 or 208-3, differential pairs of NMOS transistors Q5/Q6/Q7/Q8 or Q11/Q12/Q13/Q14, and a pair of output transistors Q9/Q10 or Q15/Q16. The input circuit 206 also generally comprises transformer 208-2 and a matching and local oscillator LO distribution network (not shown). Due to the relatively large area of the layout of the coupler 100, there is significant distance between switching circuits 204-1 and 204-2, and the transmission lines between the transformer 208-2 and the switching circuits 204-1 and 204-2 are generally employed for routing and reused to obtain the correct matching.

In operation, the mixer 200 generates in-phase and quadrature intermediate frequency signals $IF_I$ and $IF_Q$ from an RF signal $V_{RF}$ and a local oscillator signal $V_{LO}$. The transconductance circuit 202 and switching circuits 204-1 and 204-2 collectively operate in a similar manner to a pair of Gilbert cell mixers, which outputs the in-phase and quadrature intermediate frequency signals $IF_I$ and $IF_Q$. In many applications, the local oscillator signal $V_{LO}$ is phase-shifted, but, here, the hybrid coupler 100 phase-shifts the signal output from the transconductance circuit 202, while the same local oscillator signal $V_{LO}$ is applied to both switching circuits 204-1 and 204-2 to generate the in-phase and quadrature intermediate frequency signals $IF_I$ and $IF_Q$.

Figure 3:
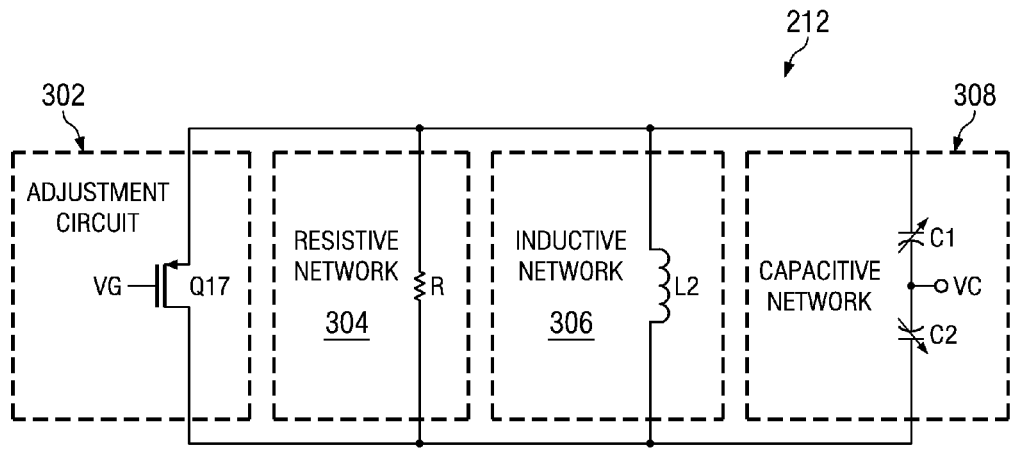
FIG. 3 is a block diagram of an example of the adjustable impedance network of FIG. 2.

To improve the performance, though, an adjustable impedance network 212 is coupled to the isolation port or port 4 instead of simply terminating port 4. As can be seen in FIG. 3, the adjustable impedance network 212 is generally comprised of a capacitive network 308, an inductive network 306, a resistive network 304, and an adjustment circuit 302 (which are coupled together). As an example, the inductive network 306 is generally comprised of an inductor L2, while resistive network 304 is generally comprised of a resistor R (which is coupled in parallel to the inductor L2). Additionally, as an example, adjustment circuit 302 is generally comprised of a PMOS transistor Q17 that receives an adjustment voltage VG at its gate. Finally, as an example, the capacitive network 308 generally comprises varactors C1 and C2 coupled in series with one another that receives a control signal VC at the node between varactors C1 and C2. Varactors are acceptable because a low Q is desirable. Alternatively, the capacitive network 308 can be comprised of a switched capacitor array that is controlled by control signal VC (which would be a digital control word); however, this configuration is less desirable because it is generally larger than varactors.

Figure 4:
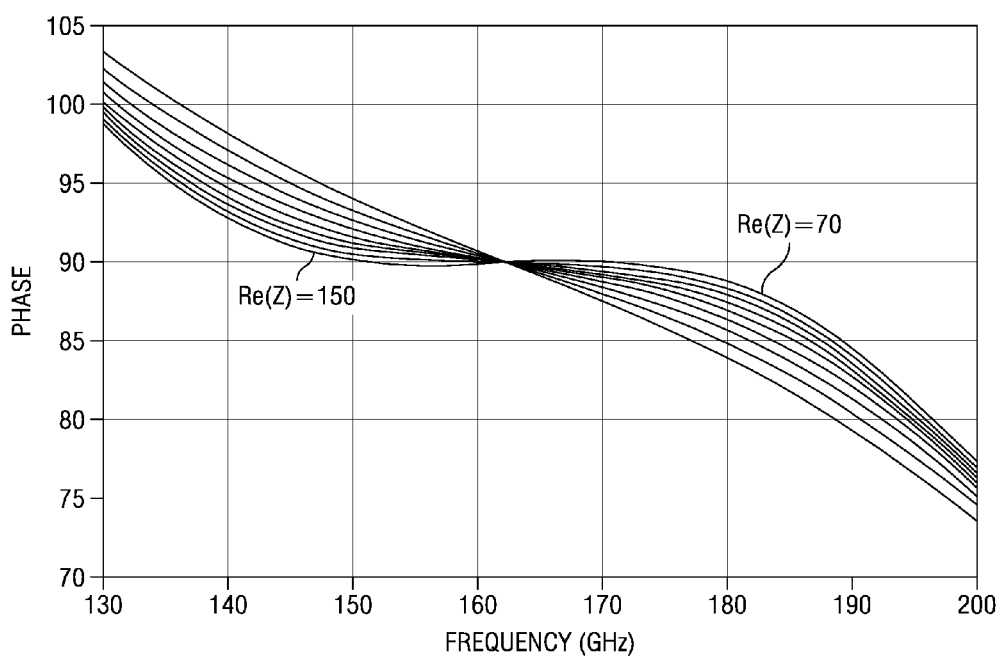
FIGS. 4-6 are graphs depicting the operation of the adjustable impedance network in conjunction with the hybrid coupler of FIG. 2.
Figure 5:
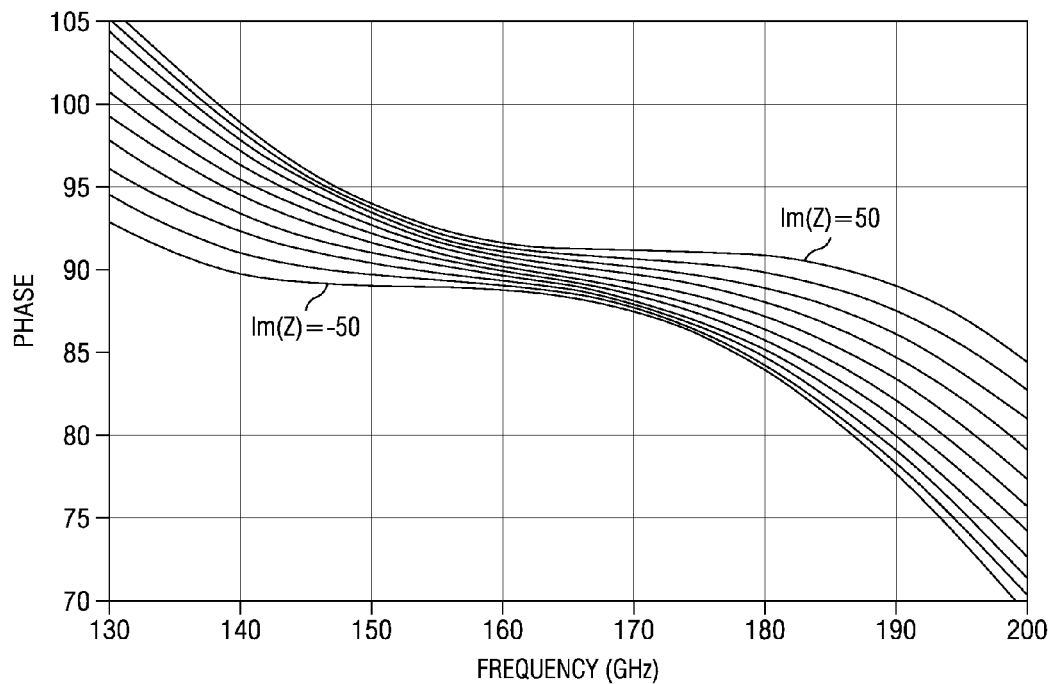

Turning to FIGS. 4 and 5, the performance of coupler 100 can be seen as the impedance of impedance network 212 is adjusted. In FIG. 4, where the nominal impedance is assumed to be 100Ω, the real part of the impedance of the adjustable impedance network 212 is swept between 70Ω and 150Ω, and it can be observed that the 90° bandwidth (between ports 2 and 3) increases as the real part becomes greater than the nominal impedance. Generally, the performance curve "flattens" at about 90° as the real part increases, meaning that the bandwidth (which is centered at about 162 GHz) increases. In FIG. 5, the imaginary part of the impedance of adjustable impedance network 212 is swept between −50Ω and 50Ω, which allows the performance curve to be shifted up and down. Thus, the performance, namely the 90° bandwidth, can be increased with adjustment of the impedance of the adjustable impedance network so as to increase the quadrature tuning range of mixer 200.

Figure 6:
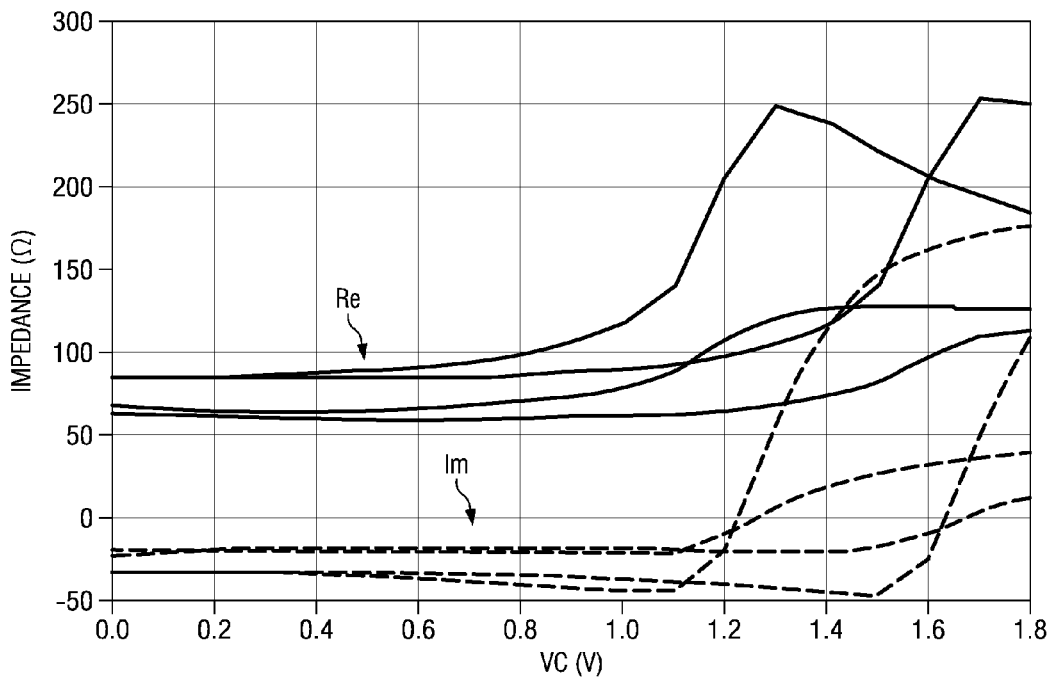

Turning to FIG. 6, the impedance for the adjustable impedance network 212 (as shown in FIG. 3) can be seen. As an example, it can be assumed that: (1) resistor R has a resistance of about 900Ω; (2) inductor L2 has an inductance of about 114 pH; and (3) transistor Q17 has an aspect ratio of 1:0.07; and (4) the voltage for signal VG is about either at 0V or at the supply voltage, for example 1.4V. As shown, the real and imaginary parts begin to significantly increase when the voltage for control signal VC increases above 1V. Thus, by adjusting voltages for signals VG and VC, a quadrature tuning range of about 20° with a negligible change in conversion gain can be realized for mixer 200.

As a result, several advantages can be realized. The adjustable impedance network 212 can compensate for in-phase/quadrature mismatch outside of coupler 100 by allowing the coupler 100 to provide an opposite in-phase/quadrature balance. Additionally, adjustable impedance network 212 can substantially increase the tuning range and expand the bandwidth of the quadrature mixer 200 (as compared to conventional mixers) within very high frequency ranges (i.e., above 100 GHz).

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
   a quadrature mixer having a branch-line hybrid coupler with an isolation port, wherein the quadrature mixer receives an input signal and a local oscillator signal, and wherein the quadrature mixer outputs an in-phase signal and a quadrature signal; and
an adjustable impedance network that is coupled to the isolation port, wherein the adjustable impedance network is controlled by a control signal, and wherein the adjustable impedance includes:
a capacitive network that is coupled to the isolation port and that receives the control signal;
a resistive network that is coupled to the capacitive network; and
a inductive network that is coupled to the resistive network.

2. The apparatus of claim 1, wherein the capacitive network further comprises a switched capacitor array.

3. The apparatus of claim 1, wherein the capacitive network further comprises a plurality of varactors coupled in series with one another, and wherein the control signal further comprises a control voltage that is received at a node between at least two of the varactors.

4. The apparatus of claim 3, wherein the inductive network further comprises an inductor that is coupled in parallel to the capacitive network.

5. The apparatus of claim 4, wherein the resistive network further comprises a resistor that is coupled in parallel to the capacitive network.

6. The apparatus of claim 5, wherein the adjustable impedance network further comprises an adjustment circuit that is coupled in parallel to the capacitive network.

7. The apparatus of claim 6, wherein the adjustment circuit further comprises a MOS transistor that receives an adjustment voltage at its gate.

8. An apparatus comprising:
a transconductance circuit that receives an input signal;
a hybrid coupler having a first port, a second port, a third port, and a fourth port, wherein the first port is coupled to the transconductance circuit;
a first switching circuit that is coupled to the second port;
a second switching circuit that is coupled to the third port;
an input circuit that is coupled to each of the first and second switching circuits, wherein the input circuit receives a local oscillator signal; and
an adjustable impedance network that is coupled to the fourth port, wherein the adjustable impedance network is controlled by a control signal, and wherein the adjustable impedance circuit includes:
a capacitive network that is coupled to the fourth port and that receives the control signal;
a resistive network that is coupled to the capacitive network; and
a inductive network that is coupled to the resistive network.

9. The apparatus of claim 8, wherein the capacitive network further comprises a switched capacitor array.

10. The apparatus of claim 8, wherein the capacitive network further comprises a plurality of varactors coupled in series with one another, and wherein the control signal further comprises a control voltage that is received at a node between at least two of the varactors.

11. The apparatus of claim 10, wherein the inductive network further comprises an inductor that is coupled in parallel to the capacitive network.

12. The apparatus of claim 11, wherein the resistive network further comprises a resistor that is coupled in parallel to the capacitive network.

13. The apparatus of claim 12, wherein the adjustable impedance network further comprises an adjustment circuit that is coupled in parallel to the capacitive network.

14. The apparatus of claim 13, wherein the adjustment circuit further comprises a MOS transistor that receives an adjustment voltage at its gate.

15. An apparatus comprising:
a transconductance circuit having:
a first differential pair of NMOS transistors, wherein each NMOS transistor from the first differential pair receive portion of a radio frequency (RF) input signal at its gate; and
an inductor that is coupled between the drains of the NMOS transistors in the first differential pair;
a pair of cascode transistor that are each coupled to the inductor; and
a coupler that is coupled to each of the pair of cascode transistors;
a hybrid coupler having a first port, a second port, a third port, and a fourth port, wherein the first port is coupled to the coupler;
a first switching circuit having:
a first transformer that is coupled to the second port;
a third differential pair of NMOS transistor that are each coupled to the first transformer; and
a fourth differential pair of NMOS transistors that are each coupled to the first transformer;
a second switching circuit having;
a second transformer that is coupled to the third port;
a fifth differential pair of NMOS transistor that are each coupled to the second transformer; and
a sixth differential pair of NMOS transistors that are each coupled to the second transformer;
an input circuit having a third transformer that is coupled to each of the first and second switching circuits, wherein the third transformer receives a local oscillator signal; and
an adjustable impedance network having:
a capacitive network that is coupled to the fourth port and that receives a control signal;
a resistive network that is coupled to the capacitive network; and
a inductive network that is coupled to the resistive network.

16. The apparatus of claim 15, wherein the capacitive network further comprises a switched capacitor array.

17. The apparatus of claim 15, wherein the capacitive network further comprises a plurality of varactors coupled in series with one another, and wherein the control signal further comprises a control voltage that is received at a node between at least two of the varactors.

18. The apparatus of claim 17, wherein the adjustable impedance network further comprises a MOS transistor that receives an adjustment voltage at its gate and that is coupled to the capacitive network at its source and drain.

* * * * *